US012669547B2

(12) United States Patent
Hong et al.

(10) Patent No.: US 12,669,547 B2
(45) Date of Patent: Jun. 30, 2026

(54) INTERNAL RESISTANCE EVALUATION DEVICE AND BATTERY SYSTEM

(71) Applicant: LG ENERGY SOLUTION, LTD., Seoul (KR)

(72) Inventors: Sung Ju Hong, Daejeon (KR); Dong Hyun Kim, Daejeon (KR); Hyo Seong An, Daejeon (KR); Geon Choi, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 187 days.

(21) Appl. No.: 18/282,185

(22) PCT Filed: Feb. 8, 2023

(86) PCT No.: PCT/KR2023/001851
§ 371 (c)(1),
(2) Date: Sep. 14, 2023

(87) PCT Pub. No.: WO2023/219233
PCT Pub. Date: Nov. 16, 2023

(65) Prior Publication Data
US 2025/0076399 A1 Mar. 6, 2025

(30) Foreign Application Priority Data
May 10, 2022 (KR) ........................ 10-2022-0057069

(51) Int. Cl.
*G01R 31/389* (2019.01)
*G01R 31/3842* (2019.01)
*G01R 31/396* (2019.01)

(52) U.S. Cl.
CPC ....... *G01R 31/389* (2019.01); *G01R 31/3842* (2019.01); *G01R 31/396* (2019.01)

(58) Field of Classification Search
CPC .............. G01R 31/389; G01R 31/3842; G01R 31/396; G01R 19/16542; G01R 31/367; G01R 31/374; Y02E 60/10
See application file for complete search history.

(56) References Cited

U.S. PATENT DOCUMENTS

| 6,160,380 | A | 12/2000 | Tsuji et al. |
| 6,278,257 | B1 | 8/2001 | Takada et al. |
(Continued)

FOREIGN PATENT DOCUMENTS

| CN | 106574948 A | 4/2017 |
| CN | 108169685 A | 6/2018 |
(Continued)

OTHER PUBLICATIONS

International Search Report issued in PCT/KR2023/001851 (PCT/ISA/210), mailed on May 12, 2023.
(Continued)

*Primary Examiner* — Daniel R Miller
(74) *Attorney, Agent, or Firm* — Birch, Stewart, Kolasch & Birch, LLP

(57) ABSTRACT

Discussed is a battery system that may include a plurality of battery packs, each of which includes a plurality of battery banks, and a battery management system that calculates a plurality of internal resistance (DCIR) values of the plurality of battery banks in each of the plurality of battery packs, and performs correction on a first internal resistance value related to a battery bank at a predetermined first position in each battery pack, and diagnoses whether the battery bank at the predetermined first position is abnormal, on the basis of the corrected first internal resistance value. Each of the plurality of battery banks may include a plurality of battery (Continued)

US 12,669,547 B2

Page 2 cells connected in parallel, and the predetermined first position is a same position in each of the plurality of battery packs.

12 Claims, 10 Drawing Sheets

(56)                    References Cited

U.S. PATENT DOCUMENTS

| | | | |
|---|---|---|---|
| 8,571,738 B1* | 10/2013 | Potter | G01R 31/396 |
| | | | 340/455 |
| 2006/0290355 A1* | 12/2006 | Lee | G01R 31/3842 |
| | | | 324/429 |
| 2007/0120537 A1 | 5/2007 | Yamamoto | |
| 2007/0200567 A1* | 8/2007 | Mizuno | G01R 31/389 |
| | | | 324/430 |
| 2008/0169789 A1* | 7/2008 | Yamabe | H02J 7/0016 |
| | | | 320/136 |
| 2014/0312910 A1* | 10/2014 | Cho | G01R 31/3842 |
| | | | 324/426 |
| 2015/0025825 A1* | 1/2015 | Yoshida | H01M 10/4257 |
| | | | 702/63 |
| 2017/0033410 A1 | 2/2017 | Tohara et al. | |
| 2018/0203070 A1 | 7/2018 | Park | |
| 2019/0081369 A1 | 3/2019 | Monden et al. | |
| 2021/0325477 A1 | 10/2021 | Imade et al. | |
| 2023/0258736 A1 | 8/2023 | Pressgrove et al. | |
| 2025/0060417 A1* | 2/2025 | Matsuda | G01R 31/3648 |

FOREIGN PATENT DOCUMENTS

| | | | |
|---|---|---|---|
| CN | 112748350 A | | 5/2021 |
| CN | 214335165 U | | 10/2021 |
| EP | 4 155 746 A1 | | 3/2023 |
| JP | 2001-95160 A | | 4/2001 |
| JP | 2002-168928 A | | 6/2002 |
| JP | 2013-96785 A | | 5/2013 |
| JP | 2014-112039 A | | 6/2014 |
| JP | 2014215276 A | * | 11/2014 |
| JP | 2020-109368 A | | 7/2020 |
| JP | 2021-144862 A | | 9/2021 |
| KR | 10-2016-0101036 A | | 8/2016 |
| KR | 10-2018-0085165 A | | 7/2018 |
| KR | 10-2018-0122378 A | | 11/2018 |
| KR | 10-2021-0017513 A | | 2/2021 |
| KR | 10-2355381 B1 | | 1/2022 |
| KR | 10-2022-0060814 A | | 5/2022 |
| WO | WO 2015/151652 A1 | | 10/2015 |
| WO | WO 2016/145621 A1 | | 9/2016 |
| WO | WO 2022/010639 A1 | | 1/2022 |
| WO | WO 2023/120186 A1 | | 6/2023 |

OTHER PUBLICATIONS

Extended European Search Report for European Application No. 23762355.8, dated Oct. 10, 2024.

* cited by examiner

【Figure 1】
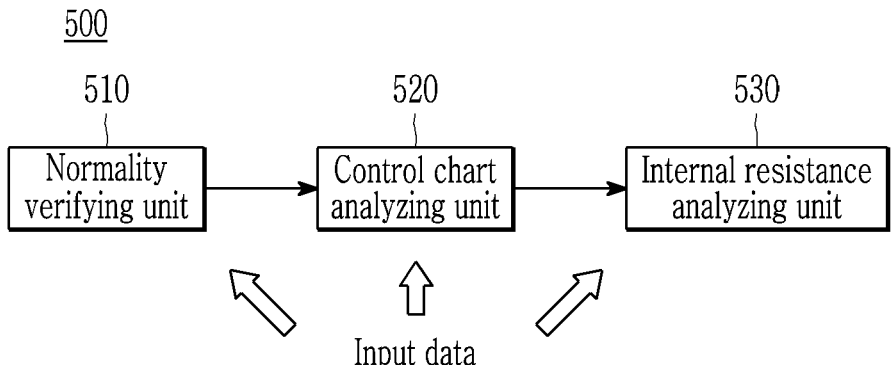
Input data

[Figure 2]
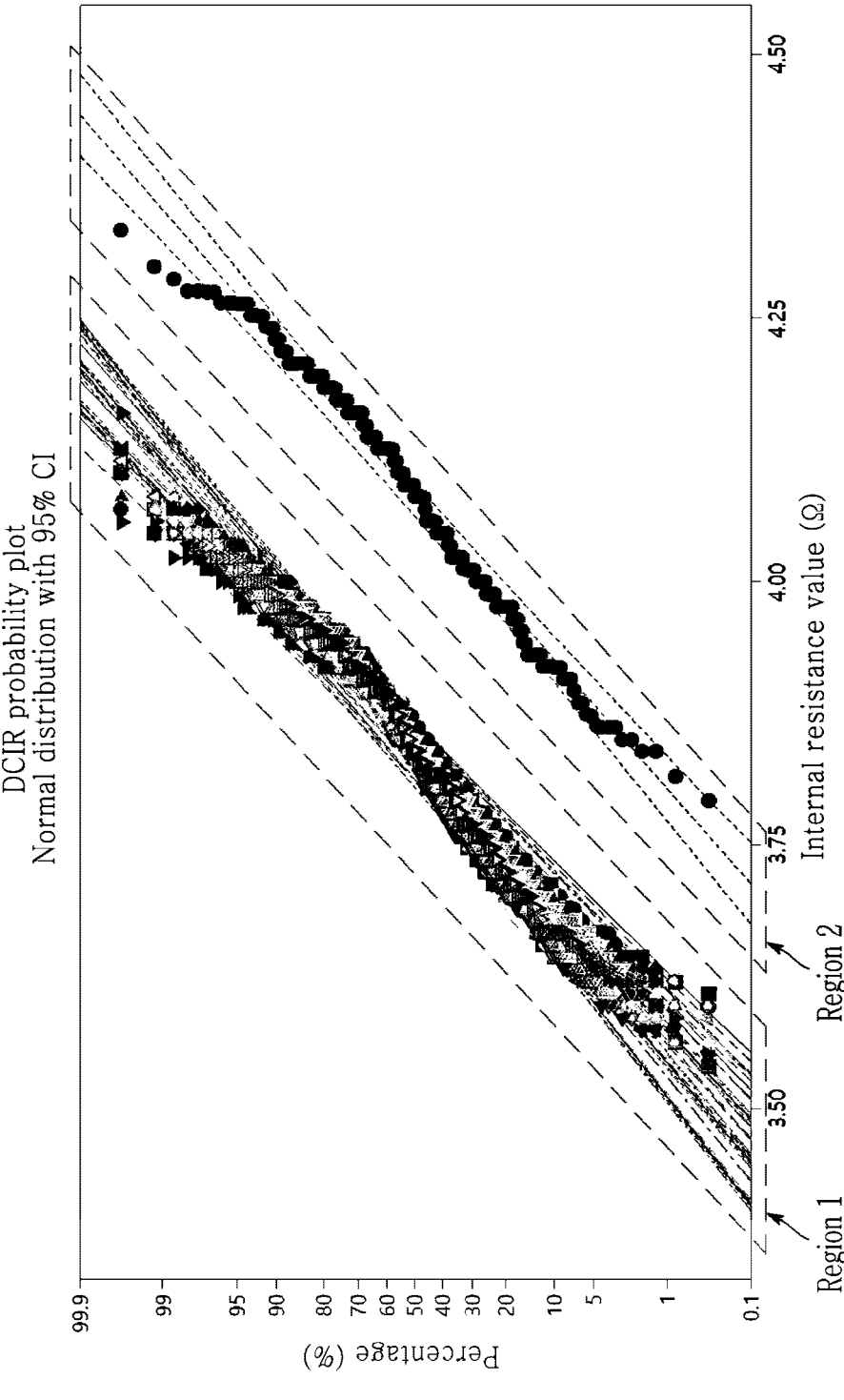
DCIR probability plot
Normal distribution with 95% CI

[Figure 3]
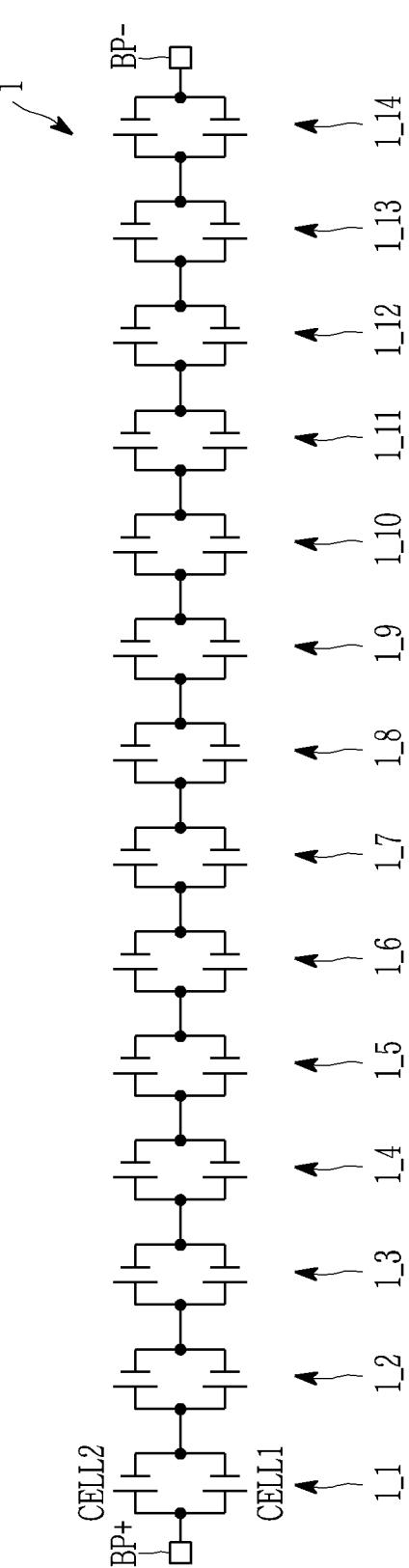

[Figure 4]
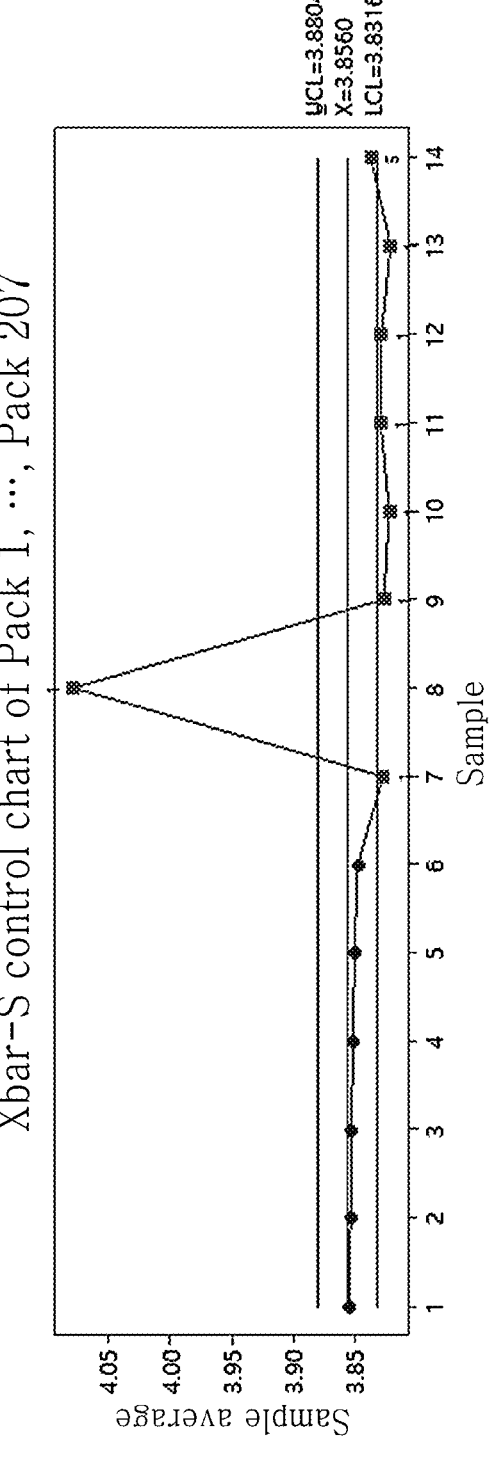

[Figure 5]
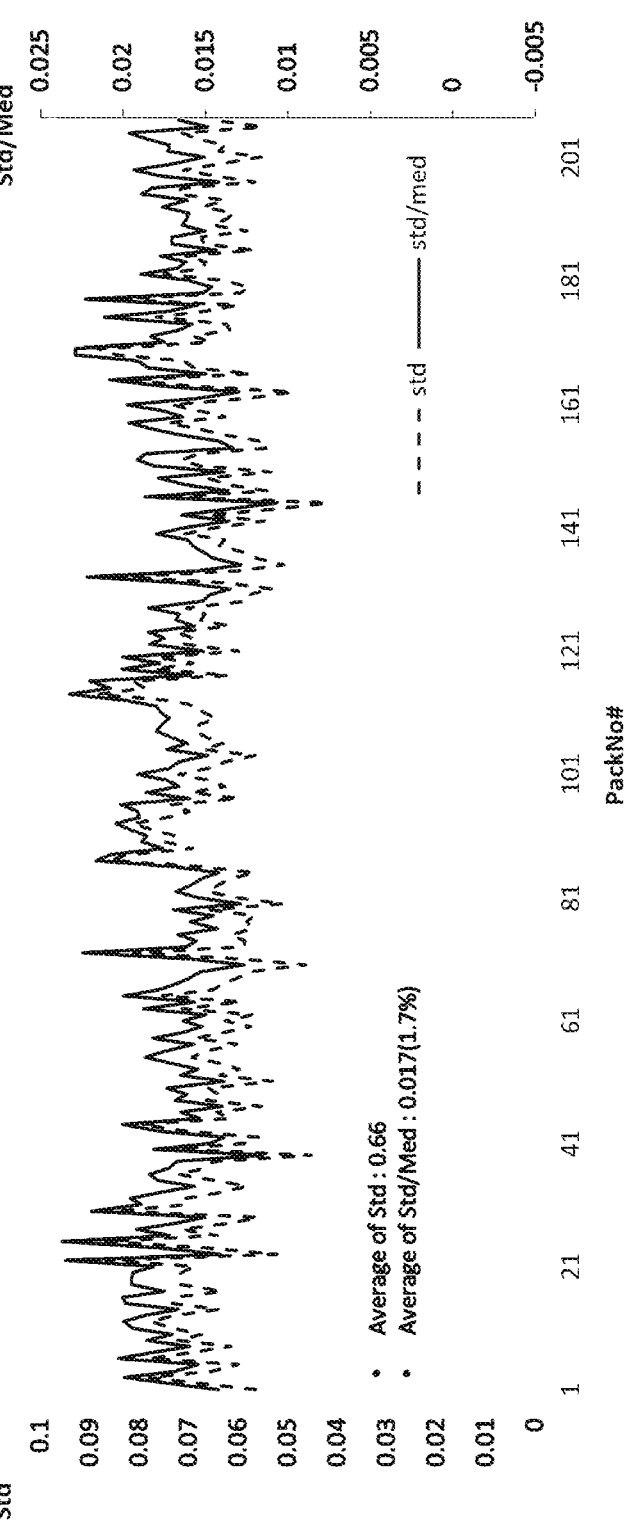

[Figure 6]
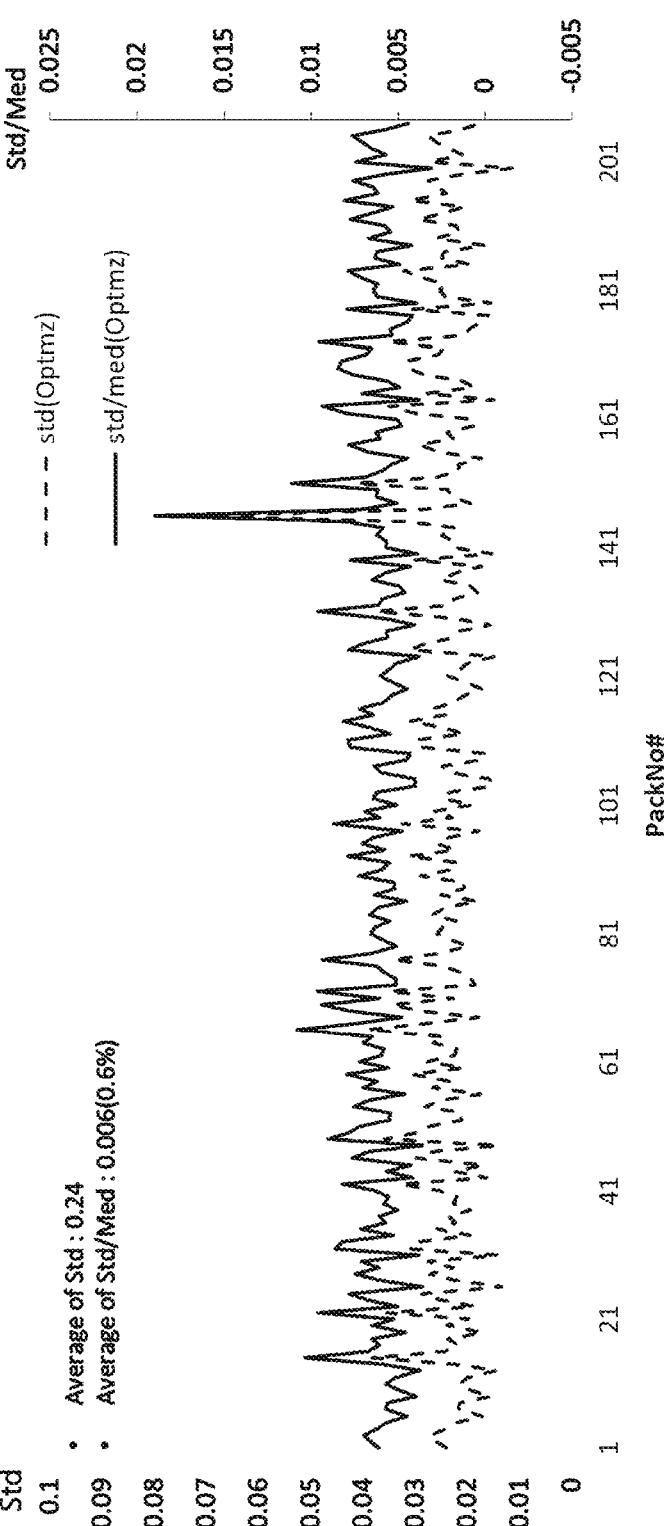

[Figure 7]
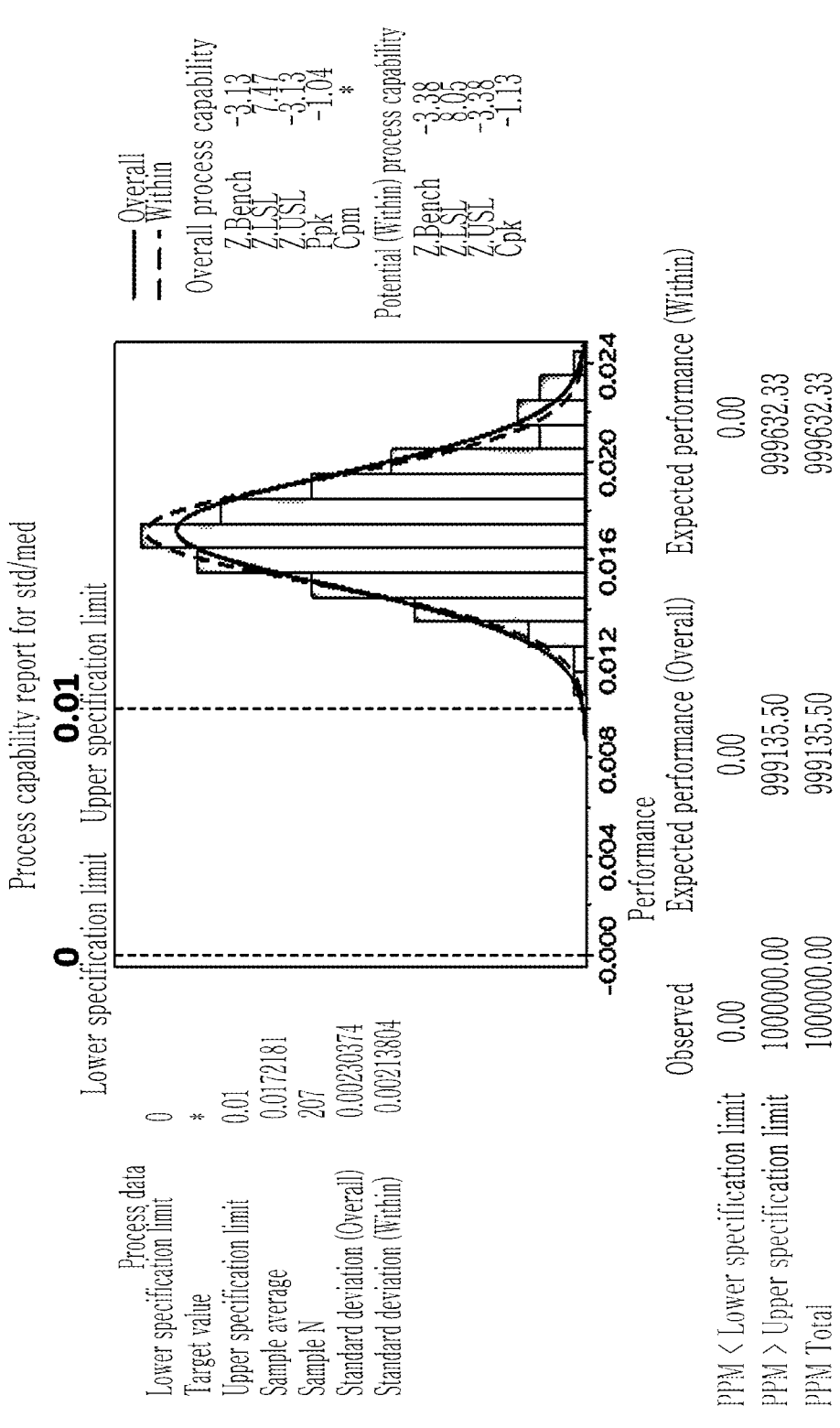
Process capability report for std/med

[Figure 8]
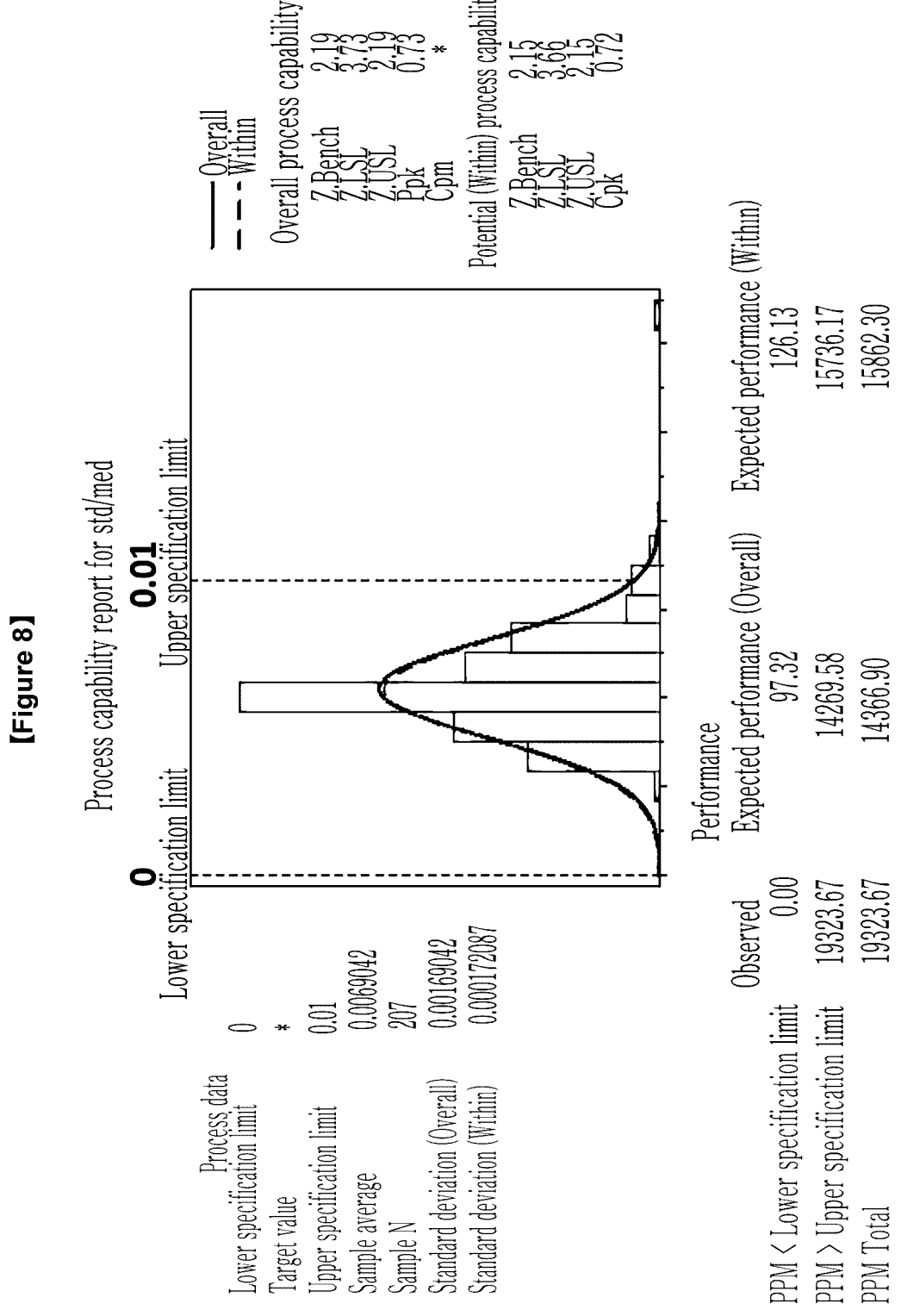

[Figure 9]
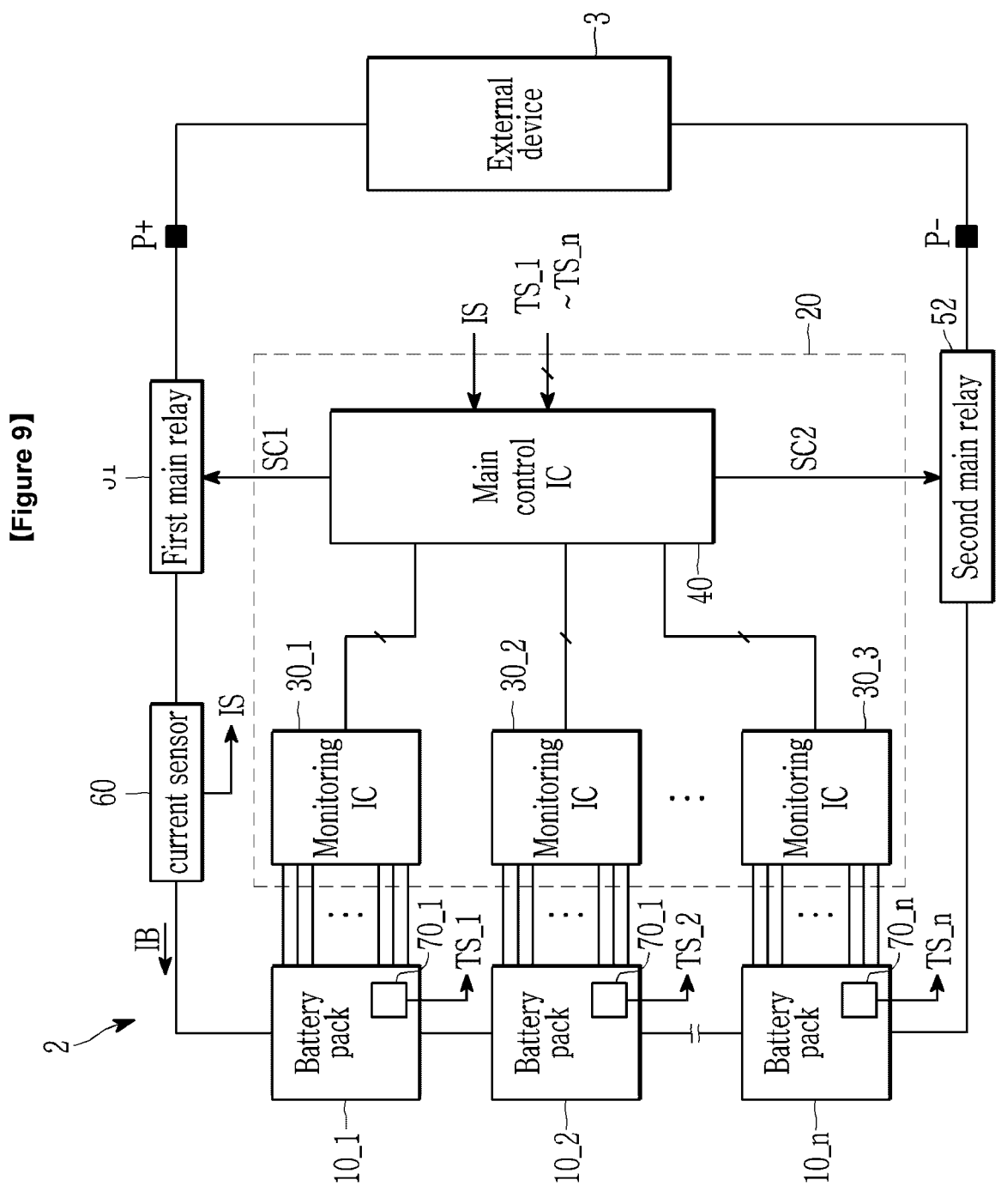

【Figure 10】
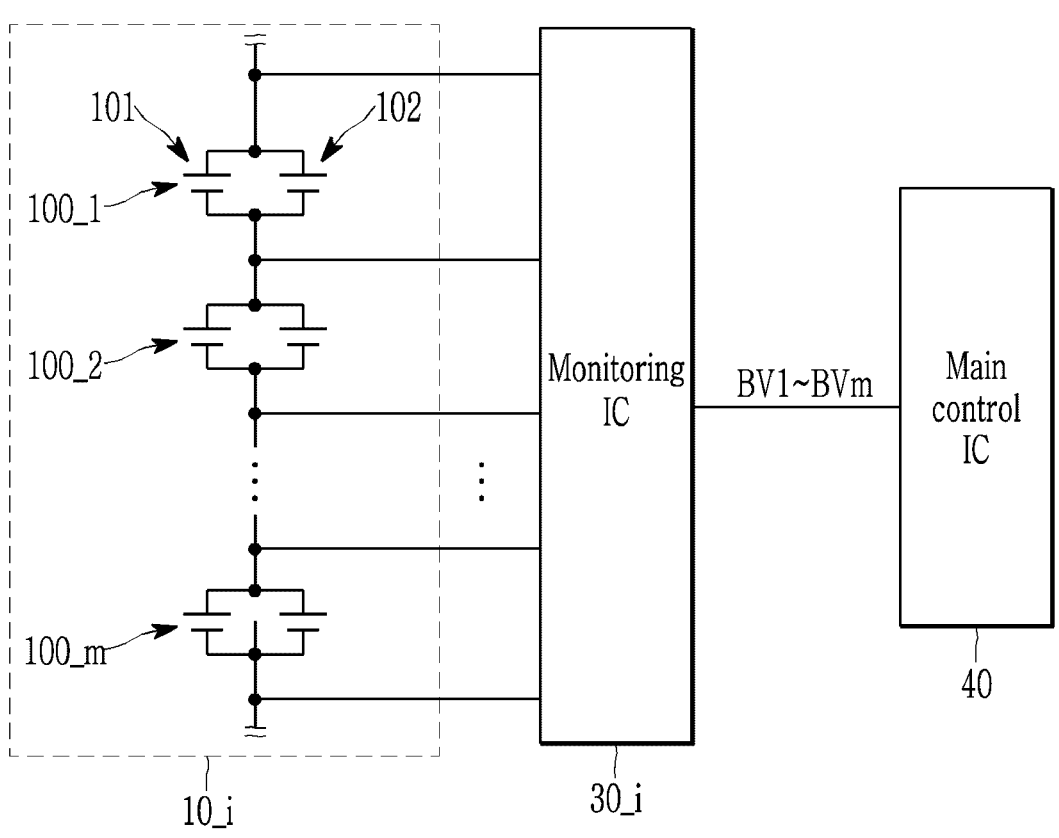

INTERNAL RESISTANCE EVALUATION DEVICE AND BATTERY SYSTEM

TECHNICAL FIELD

Cross-Reference to Related Application

This application claims priority to and the benefit of Korean Patent Application No. 10-2022-0057069 filed in the Korean Intellectual Property Office on May 10, 2022, the entire contents of which are incorporated herein by reference The present disclosure relates to an internal resistance evaluation device and a battery system using information derived from the internal resistance evaluation device.

BACKGROUND ART

A plurality of battery cells which constitutes a battery pack is electrically connected, for example, in series, in parallel, or in a series-parallel combination. In this case, due to a plurality of contact resistances and coupling resistances among the plurality of battery cells, when a current flows in the battery pack, a voltage higher than the cell voltage of each of the plurality of battery cells is measured as the cell voltage of the corresponding battery cell. In other words, measuring the cell voltage of each battery cell is affected not only by the internal resistance of the corresponding battery cell but also by the mechanical resistances of coupling members used to connect the plurality of battery cells.

Like this, there is a problem that it is difficult to accurately measure the cell voltages. The cell voltages are important data in monitoring the states of the battery cells, such as the states of charge of the battery cells, overvoltage, low voltage, etc.

DISCLOSURE

Technical Problem

In order to solve the above-mentioned problem of the related art, the present disclosure attempts to provide an internal resistance evaluation device implemented so as to be able to accurately measure the internal resistance values of a plurality of battery banks, and a battery system using information derived from the internal resistance evaluation device.

Technical Solution

A battery system according to a feature of the invention may include a plurality of battery packs, each of which includes a plurality of battery banks, and a battery management system that calculates a plurality of internal resistance (DCIR) values of the plurality of battery banks in each of the plurality of battery packs, and performs correction on a first internal resistance value related to a battery bank at a predetermined first position in each battery pack, and diagnoses whether the battery bank at the predetermined first position is abnormal, on the basis of the corrected first internal resistance value. Each of the plurality of battery banks may include a plurality of battery cells connected in parallel, and the predetermined first position is a same position in each of the plurality of battery packs.

The battery management system may correct the first internal resistance value by multiplying the first internal resistance value by a predetermined ratio smaller than 1.

The predetermined ratio may be determined on the basis of a result obtained by dividing the first internal resistance value of the battery bank at the predetermined first position in each battery pack by a median value of the plurality of internal resistance values of the plurality of battery banks constituting a corresponding battery pack.

The battery system may further include a plurality of monitoring ICs that are connected to the plurality of battery packs, and measures the plurality of battery bank voltages of the plurality of battery banks, and a main control IC that calculates a plurality of internal resistance values of the plurality of battery banks of each battery bank on the basis of the plurality of battery bank voltages and a current flowing in each battery bank, with respect to each of the plurality of battery packs, and corrects the first internal resistance value of the battery bank at the predetermined first position on the basis of a predetermined ratio.

The main control IC may correct the first internal resistance value of the battery bank at the predetermined first position by multiplying the first internal resistance value of the battery bank at the predetermined first position by the predetermined ratio, and the predetermined ratio may be smaller than 1.

The predetermined ratio may be determined on the basis of a result obtained by dividing the first internal resistance value of the battery bank at the predetermined first position in each battery pack by a median value of the plurality of internal resistance values of the plurality of battery banks constituting a corresponding battery pack.

In each battery pack, the first internal resistance of the battery bank at the predetermined first position may be more affected by a mechanical resistance as compared to battery banks at other positions in a corresponding battery pack.

With respect to all of the plurality of battery packs, the plurality of internal resistance values may be classified by positions of the plurality of battery banks, and a position of a battery bank corresponding to the plurality of internal resistance values determined as being out of a normal range may be determined as the predetermined first position.

An internal resistance evaluation device according to another feature of the invention may include a normality verifying unit configured to verify normality with respect to a plurality of internal resistance values of a plurality of battery banks constituting each battery pack with respect to a plurality of battery packs, a control chart analyzing unit configured to classify the plurality of internal resistance values by a plurality of battery bank positions, with respect to all of the plurality of battery packs, and determine a first position of a battery bank corresponding to an internal resistance value determined as being out of a normal range among the plurality of resistance values, and an internal resistance analyzing unit configured to determine a correction degree on the basis of the internal resistance value of the battery bank at the predetermined first position and the plurality of internal resistance values of a plurality of battery banks constituting each battery pack.

The internal resistance analyzing unit may calculate a first value with respect to each of the plurality of battery packs by dividing the internal resistance value of the battery bank at the first position by a median value of the plurality of internal resistances of the plurality of battery banks constituting each battery pack, and determines a correction degree on the basis of an average of a plurality of first values with respect to all of the plurality of battery packs.

The internal resistance analyzing unit may determine, as the correction degree, a value obtained by subtracting 1 from the average of the plurality of first values.

The normality verifying unit may verify the normality of the plurality of internal resistances at each battery bank position with respect to all of the plurality of battery packs.

Advantageous Effects

The present invention provides an internal resistance evaluation device implemented so as to be able to accurately measure the internal resistance values of a plurality of battery banks, and a battery system using information derived from the internal resistance evaluation device.

DESCRIPTION OF THE DRAWINGS

FIG. 1 is a drawing illustrating an internal resistance evaluation device according to an exemplary embodiment.

FIG. 2 is a probability plot illustrating a reference value distribution of internal resistances of a plurality of battery banks of a plurality of battery packs.

FIG. 3 is a circuit diagram illustrating a battery pack according to the exemplary embodiment.

FIG. 4 is a graph illustrating an Xbar-S control chart related to averages of internal resistance values.

FIG. 5 shows standard deviations related to a plurality of battery banks of 207 battery packs, and results obtained by dividing the standard deviations by median values (ratios of the standard deviations to the median values).

FIG. 6 shows standard deviations related to the plurality of battery banks of the 207 battery packs, and results obtained by dividing the standard deviations by the median values, when the internal resistance values of the battery banks located at eighth positions having large internal resistance values were corrected.

FIG. 7 shows a process capability analysis result based on the ratios of the standard deviations to the median values shown in FIG. 5.

FIG. 8 shows a process capability analysis result based on the ratios of the standard deviations to the median values shown in FIG. 6.

FIG. 9 is a drawing illustrating a battery system according to an exemplary embodiment.

FIG. 10 is a drawing illustrating a battery pack according to an exemplary embodiment.

MODE FOR INVENTION

The present invention may relate to a battery system including a plurality of battery packs, each of which includes a plurality of battery cells electrically connected. Each battery pack may include a plurality of battery cells connected in series, or may include a plurality of battery banks, each of which consists of at least two battery cells connected in parallel.

Hereinafter, exemplary embodiments disclosed in this specification will be described in detail with reference to the accompanying drawings; however, the same or similar constituent components are denoted by the same or similar reference symbols, and a repeated description thereof will not be made. As used herein, the suffix 'module' and/or the suffix 'unit' for constituent elements are given and used interchangeably in consideration of only ease of preparing this specification, and the suffixes themselves do not have meanings or roles distinguishable from each other. Further, when describing exemplary embodiments disclosed in this specification, detailed descriptions of publicly known technologies will be omitted if it is determined that specific description thereof may obscure the gist of the exemplary embodiments disclosed in this specification. Furthermore, the accompanying drawings are provided for helping to easily understand exemplary embodiments disclosed in the present specification, and the technical spirit disclosed in the present specification is not limited by the accompanying drawings, and it will be appreciated that the present invention includes all of the modifications, equivalent matters, and substitutes included in the spirit and the technical scope of the present invention.

Terms including an ordinal number, such as first and second, are used for describing various constituent elements, but the constituent elements are not limited by the terms. The terms are used only to discriminate one constituent element from another constituent element.

In the present application, it will be appreciated that terms "including" and "having" are intended to designate the existence of characteristics, numbers, steps, operations, constituent elements, and components described in the specification or a combination thereof, and do not exclude a possibility of the existence or addition of one or more other characteristics, numbers, steps, operations, constituent elements, and components, or a combination thereof in advance.

In a component for controlling other components under a specific control condition among components according to an exemplary embodiment, a program implemented as a set of commands specifying a control algorithm necessary to control other components may be installed. The control component may generate output data by processing input data and stored data according to the installed program. The control component may include a non-volatile memory for storing programs and a memory for storing data.

In a plurality of battery packs having the same structure, specific battery cells or specific battery banks may have internal resistances higher than those of the other battery cells or the other battery banks. Depending on the positions of individual battery cells or banks in each battery pack, the type, number, and shape of coupling members connected to each battery cell or bank, such as busbars, wiring lines, etc., may vary. Contact resistance, coupling resistance, etc. due to coupling members may occur, and they will hereinafter be referred to as mechanical resistance. Among the plurality of internal resistances of a plurality of battery banks, internal resistances, which are relatively more affected by the mechanical resistances, may have resistance values larger than those of internal resistances which are relatively less affected.

A normality verifying method according to an exemplary embodiment may include a step of deriving the distribution of the internal resistances of a plurality of battery cells or a plurality of battery banks at each position in a plurality of battery packs, a step of comparing the internal resistance distributions related to all positions each other, and a step of determining positions out of a normal range defined based on internal resistance distributions different from the internal resistance distribution of all positions on the basis of the comparison results.

A battery system according to an exemplary embodiment may compensate calculated internal resistances using battery cell voltages and currents or battery bank voltages and currents, when determining internal resistances related to battery cells or battery banks corresponding to a position obtained by a normality verifying method.

The following description will be made to provide an internal resistance value correcting method capable of reducing an effect of mechanical resistances by analyzing the internal resistance values of a plurality of battery banks in a structure in which each battery pack includes a plurality of battery banks connected in series, and a battery system using the same.

FIG. 1 is a drawing illustrating an internal resistance evaluation device according to an exemplary embodiment.

As shown in FIG. 1, an internal resistance evaluation device 500 includes a normality verifying unit 510, a control chart analyzing unit 520, and an internal resistance analyzing unit 530.

FIG. 2 is a probability plot illustrating a reference value distribution of internal resistances of a plurality of battery banks of a plurality of battery packs.

FIG. 3 is a circuit diagram illustrating a battery pack according to an exemplary embodiment.

As shown in FIG. 3, a battery pack 1 may include fourteen battery banks 1_1 to 1_14 connected in series. Each of the fourteen battery banks 1_1 to 1_14 includes two battery cells CELL1 and CELL2 connected in parallel. The fourteen battery banks 1_1 to 1_14 are connected in series between the anode terminal BP+ and cathode terminal BP– of the battery pack 1. Although it is shown in FIG. 3 that the battery pack 1 includes the fourteen battery banks and each battery bank includes two battery cells, the number of battery banks constituting a battery pack may be different from 14, and each battery bank may include three or more battery cells connected in parallel.

In the probability plot of FIG. 2, data on the internal resistance values DCIR1 to DCIR14 of fourteen battery banks of each of a total of 207 battery packs (hereinafter, referred to as input data) were used. Input data may be directly measured, or may be calculated by dividing a change in the voltage of each battery bank by a current flowing in the corresponding battery bank. Each of the fourteen battery banks may be distinguished depending on the corresponding position. The position of each of the plurality of battery banks connected in series between the anode terminal and the cathode terminal in the battery pack refers to the relative position thereof. For example, in the battery pack 1, first to fourteenth positions may be defined along a direction from the anode terminal BP+ to the cathode terminal BP–, or conversely, first to fourteenth positions may be defined along a direction from the cathode terminal BP– to the anode terminal BP+.

The horizontal axis of FIG. 2 represents internal resistance value, and the vertical axis represents possibility based on the numbers of battery banks having the internal resistance values of battery banks at the same positions in the 207 battery packs. For example, if the possibility is PA % when DCIR1 of a battery bank at the first position (for example, reference symbol "1_1") is a specific value RA (Ω), the number of battery banks having the internal resistance value of RA (Ω) among the first-position battery banks (reference symbol "1_1" in FIG. 3) of the total of 207 battery packs may be 207*PA/100.

As shown in FIG. 2, the internal resistances DCIR1 to DCIR7 and DCIR9 to DCIR14 of thirteen battery banks among the fourteen battery banks of each of the total of 207 battery packs are distributed in region 1. However, the internal resistance DCIR8 of the eighth-position battery bank is distributed in region 2 distinguished from region 1.

The normality verifying unit 510 may verify the normality of input data. Specifically, the normality verifying unit 510 may calculate P values related to the internal resistance values DCIR1 to DCIR14, and verify the normality based on the result of determining whether each calculated P value is equal to or smaller than a predetermined reference value. All P values related to the internal resistance values DCIR1 to DCIR14 of the fourteen battery banks in the 207 battery packs shown in FIG. 3 are equal to or smaller than 0.05. Therefore, it can be seen that in the 207 battery packs, the internal resistance values of the fourteen battery banks are normal. If the verification of the normality is completed, a control chart of the internal resistance values of the fourteen battery banks in the 207 battery packs can be analyzed. When completing the normality verification on the input data, the normality verifying unit 510 may transmit them to the control chart analyzing unit 520.

The control chart analyzing unit 520 may calculate statistical values related to the internal resistance values of the plurality of battery banks with respect to the plurality of battery packs, as shown in Table 1. The statistical values include averages (Avg), median values (med), minimums (min), maximums (max), standard deviations (std), and the ratios of standard deviations to median values (std/med).

TABLE 1

| DCIR(m$\Omega$) | Avg | med | min | max | std | std/med |
|---|---|---|---|---|---|---|
| DCIR1 | 3.855 | 3.862 | 3.597 | 4.069 | 0.109 | 0.028 |
| DCIR2 | 3.854 | 3.851 | 3.609 | 4.104 | 0.111 | 0.029 |
| DCIR3 | 3.853 | 3.862 | 3.597 | 4.115 | 0.115 | 0.030 |
| DCIR4 | 3.851 | 3.851 | 3.586 | 4.115 | 0.115 | 0.030 |
| DCIR5 | 3.851 | 3.851 | 3.597 | 4.104 | 0.115 | 0.030 |
| DCIR6 | 3.848 | 3.850 | 3.597 | 4.115 | 0.114 | 0.030 |
| DCIR7 | 3.827 | 3.839 | 3.551 | 4.057 | 0.109 | 0.028 |
| DCIR8 | 4.078 | 4.081 | 3.793 | 4.334 | 0.118 | 0.029 |
| DCIR9 | 3.827 | 3.839 | 3.540 | 4.127 | 0.121 | 0.032 |
| DCIR10 | 3.822 | 3.828 | 3.563 | 4.138 | 0.122 | 0.032 |
| DCIR11 | 3.829 | 3.828 | 3.540 | 4.115 | 0.123 | 0.032 |
| DCIR12 | 3.829 | 3.839 | 3.540 | 4.081 | 0.121 | 0.032 |
| DCIR13 | 3.821 | 3.839 | 3.551 | 4.104 | 0.121 | 0.031 |
| DCIR14 | 3.837 | 3.839 | 3.551 | 4.161 | 0.118 | 0.031 |

The control chart analyzing unit 520 may deduce that the resistance value DCIR8 of the resistance values DCIR1 to DCIR14 of the internal resistances is larger than the other resistance values DCIR as shown in Table 1. For example, in the 207 battery packs, the average (Avg), median value (med), minimum (min), and maximum (max) of the internal resistance values DCIR8 of the battery banks at the eighth positions (for example, reference symbol "1-8" in FIG. 3) are larger than the averages (Avg), median values (med), minimums (min), and maximums (max) of the internal resistance values DCIR1 to DCIR 7 and DCIR9 to DCIR14 of the battery banks at the other positions (for example, reference symbols "1_1" to "1_7" and "1_9" to "1_14" in FIG. 3). The control chart analyzing unit 520 may inform the internal resistance analyzing unit 530 that the statistical values of the battery banks at the eighth positions are larger than those of the other battery banks.

FIG. 4 is a graph illustrating an Xbar-S control chart related to averages of the internal resistance values.

In FIG. 4, the averages related to the internal resistance values of 14 battery banks with respect to the 207 battery packs is shown. In FIG. 4, the x axis represents the battery bank positions of 14 battery banks, and the values on the x axis are from the first position to the fourteenth position, and the y axis represents the averages related to the internal resistance values DCIR1 to DCIR14 of fourteen battery banks, and the values on the y axis represent the resistance values of internal resistances. The control chart analyzing unit 520 can deduce that the average of DCIR8 is larger as compared to the other DCIRs and exceeds the upper limit UCL of the control chart, as shown in FIG. 4.

The internal resistance analyzing unit 530 may calculate the average (Avg), the median value (med), the minimum (min), the maximum (max), the standard deviation (std), and the ratio of the standard deviation to the median value (std/med) with respect to the internal resistance values of all battery banks in the 207 battery packs, as shown in Table 2.

TABLE 2

| Avg | med | min | max | std | std/med |
|---|---|---|---|---|---|
| 3.856 | 3.862 | 3.540 | 4.334 | 0.133 | 0.034 |

The internal resistance analyzing unit 530 may calculate the averages (Avg), the median values (med), the minimums (min), the maximums (max), the standard deviations (std), and the ratios of the standard deviations to the median values (std/med) with respect to the averages (Avg), the median values (med), the minimums (min), and the maximums (max) related to the internal resistance values of fourteen battery banks in each of the 207 battery packs, as shown in Table 3.

TABLE 3

| | | Regarding pack-unit DCIRs | | | | | |
|---|---|---|---|---|---|---|---|
| | | Avg | med | min | max | std | std/med |
| Regarding | Avg | 3.856 | 3.842 | 3.798 | 4.078 | 0.066 | 0.017 |
| data on 207 | med | 3.859 | 3.840 | 3.805 | 4.081 | 0.066 | 0.017 |
| battery | min | 3.590 | 3.580 | 3.540 | 3.793 | 0.042 | 0.011 |
| packs | max | 4.122 | 4.115 | 4.023 | 4.334 | 0.089 | 0.024 |

The internal resistance analyzing unit 530 may perform an operation of calculating the average of the internal resistance values of fourteen battery banks constituting one battery pack (hereinafter, referred to as a pack-unit bank internal resistance average) with respect to all of the 207 battery packs. Then, 207 pack-unit bank internal resistance averages are calculated, and in the above Table 3, the row defined by "Avg" on the vertical axis represents statistical values related to the 207 pack-unit bank internal resistance averages. In other words, "3.856" is the average (Avg) of the 207 pack-unit bank internal resistance averages, and "3.842" is the median value (med) of the 207 pack-unit bank internal resistance averages, and "3.798" is the minimum (min) of the 207 pack-unit bank internal resistance averages, and "4.078" is the maximum (max) of the 207 pack-unit bank internal resistance averages, and "0.066" is the standard deviation (std) of the 207 pack-unit bank internal resistance averages, and "0.017" is the ratio of the standard deviation (std) of the 207 pack-unit bank internal resistance averages to the median value (med) (std/med).

The internal resistance analyzing unit 530 may perform an operation of calculating the median value of the internal resistance values of fourteen battery banks constituting one battery pack (hereinafter, referred to as a pack-unit bank internal resistance median value) with respect to all of the 207 battery packs. Then, 207 pack-unit bank internal resistance median values are calculated, and in the above Table 3, the row defined by "med" on the vertical axis represents statistical values related to the 207 pack-unit bank internal resistance median values. In other words, "3.859" is the average (Avg) of the 207 pack-unit bank internal resistance median values, and "3.840" is the median value (med) of the 207 pack-unit bank internal resistance median values, and "3.805" is the minimum (min) of the 207 pack-unit bank internal resistance median values, and "4.081" is the maximum (max) of the 207 pack-unit bank internal resistance median values, and "0.066" is the standard deviation (std) of the 207 pack-unit bank internal resistance median values, and "0.017" is the ratio of the standard deviation (std) of the 207 pack-unit bank internal resistance median values to the median value (med) (std/med).

The internal resistance analyzing unit 530 may perform an operation of calculating the minimum of the internal resistance values of fourteen battery banks constituting one battery pack (hereinafter, referred to as a pack-unit bank internal resistance minimum) with respect to all of the 207 battery packs. Then, 207 pack-unit bank internal resistance minimums are calculated, and in the above Table 3, the row defined by "min" on the vertical axis represents statistical values related to the 207 pack-unit bank internal resistance minimums. In other words, "3.590" is the average (Avg) of the 207 pack-unit bank internal resistance minimums, and "3.580" is the median value (med) of the 207 pack-unit bank internal resistance minimums, and "3.540" is the minimum (min) of the 207 pack-unit bank internal resistance minimums, and "3.793" is the maximum (max) of the 207 pack-unit bank internal resistance minimums, and "0.042" is the standard deviation (std) of the 207 pack-unit bank internal resistance minimums, and "0.011" is the ratio of the standard deviation (std) of the 207 pack-unit bank internal resistance minimums to the median value (med) (std/med).

The internal resistance analyzing unit 530 may perform an operation of calculating the maximum of the internal resistance values of fourteen battery banks constituting one battery pack (hereinafter, referred to as a pack-unit bank internal resistance maximum) with respect to all of the 207 battery packs. Then, 207 pack-unit bank internal resistance maximums are calculated, and in the above Table 3, the row defined by "max" on the vertical axis represents statistical values related to the 207 pack-unit bank internal resistance maximums. In other words, "4.122" is the average (Avg) of the 207 pack-unit bank internal resistance maximums, and "4.115" is the median value (med) of the 207 pack-unit bank internal resistance maximums, and "4.023" is the minimum (min) of the 207 pack-unit bank internal resistance maximums, and "4.334" is the maximum (max) of the 207 pack-unit bank internal resistance maximums, and "0.089" is the standard deviation (std) of the 207 pack-unit bank internal resistance maximums, and "0.024" is the ratio of the standard deviation (std) of the 207 pack-unit bank internal resistance maximums to the median value (med) (std/med).

The internal resistance analyzing unit 530 may perform an operation of dividing the internal resistance value of a battery bank at the eighth position in one battery pack by the median value of the internal resistance values of fourteen battery banks constituting the corresponding battery pack to calculate the ratio of the internal resistance value of the battery bank at the eighth position to the pack-unit bank internal resistance median value (hereinafter, referred to as a resistance ratio value), with respect to all of the 207 battery packs. Then, 207 resistance ratio values are calculated, and Table 4 is a table representing the average, the median value, the minimum, the maximum, the standard deviation, and the ratio of the standard deviation to the median value, related to the 207 resistance ratio values.

TABLE 4

| DCIR8/med | Avg | med | min | max | std | std/med |
|---|---|---|---|---|---|---|
| | 1.062 | 1.061 | 1.034 | 1.088 | 0.010 | 0.009 |

As shown in Table 4, as the average of the resistance ratio values of the battery banks at the eighth positions in the 207 battery packs, 1.062 was measured, which was 6.2% larger than the median value. In Table 3, since the ratio of the standard deviation of the pack-unit bank internal resistance averages to the median value (std/med) is 1.7%, it can be interpreted as the average of standard dispersions of battery banks in the 207 battery packs is 1.7%. Therefore, it can be seen that the internal resistance values of the battery banks at the eighth positions are larger than the internal resistance values of battery banks at the other positions. This can be interpreted as the internal resistances of the battery banks at the eighth positions are more affected by the mechanical resistance as compared to the battery banks at the other positions. In this case, the internal resistance analyzing unit 530 may determine 6.2% as a correction degree for the internal resistance values of the battery banks at the eighth positions. Then, in order to correct the internal resistance values of the battery banks at the eighth positions, the internal resistance values may be multiplied by 93.8% (100%-6.2%).

FIG. 5 shows standard deviations related to a plurality of battery banks of 207 battery packs, and results obtained by dividing the standard deviations by median values (ratios of the standard deviations to the median values).

FIG. 6 shows standard deviations related to the plurality of battery banks of the 207 battery packs, and results obtained by dividing the standard deviations by the median values, when the internal resistance values of the battery banks located at eighth positions having large internal resistance values were corrected.

As can be seen from comparison of FIG. 5 and FIG. 6, it can be seen that the standard deviations and dispersion average of the plurality of battery banks of the 207 battery packs are reduced by 65% as compared to the previous ones.

FIG. 7 shows a process capability analysis result based on the ratios of the standard deviations to the median values shown in FIG. 5.

FIG. 8 shows a process capability analysis result based on the ratios of the standard deviations to the median values shown in FIG. 6.

In FIG. 7, it is shown that most of the ratios of the standard deviations to the median values related to the 207 battery packs are larger than the upper specification limit of 0.01.

On the other hand, in FIG. 8, it is shown that most of the ratios of the standard deviations to the median values related to the 207 battery packs are smaller than the upper specification limit of 0.01.

In addition, as can seen from the process capability analysis results shown in FIG. 7 and FIG. 8, it is shown that the process capability was also improved.

As described above, accurate internal resistance values can be determined by deriving battery banks having internal resistance values larger than those of other battery banks and correcting the internal resistance values of the corresponding battery banks. This is used in a battery system which will hereinafter be described. A battery system according to an exemplary embodiment can remove the influence of mechanical resistance from calculated internal resistance values in determining the internal resistances of battery banks at specific positions using information on specific battery banks having large internal resistance values.

FIG. 9 is a drawing illustrating a battery system according to an exemplary embodiment.

In FIG. 9, a battery system 2 includes a plurality of battery packs 10_1 to 10_*n* (wherein n is a natural number of 2 or greater) and a battery management system 20. The battery management system 20 may include a plurality of monitoring ICs 30_1 to 30_*n* connected to the plurality of battery packs 10_1 to 10_*n*, respectively, and a main control IC 40. The battery system 2 may further include a first main relay 51 connected between an output terminal P+ and the anode of the battery pack 10_1, and a second main relay 52 connected between an output terminal P− and the cathode of the battery pack 10_*n*.

The first main relay 51 and the second main relay 52 may be switched by control of the battery management system 20. For example, the main control IC 40 may generate switching signals SC1 and SC2 for controlling the switching operations of the first and second main relays 51 and 52, and supply them to the first and second main relays 51 and 52. Although the two main relays are shown in FIG. 9, the invention is not limited thereto. For example, in the battery system 2, a pre-charge relay and a pre-charge resistor may be connected in parallel with one of the two main relays. Also, the battery system 2 may include only one of the two main relays.

Between the output terminal P+ and the output terminal P−, an external device 3 may be connected. The external device 3 may be a charger for supplying power, supplied from the plurality of battery packs 10_1 to 10_*n* by discharging of the plurality of battery packs 10_1 to 10_*n*, to an external load (for example, a motor for supplying driving power to an electric vehicle) or supplying power for charging the plurality of battery packs 10_1 to 10_*n* from an external commercial power source.

FIG. 10 is a drawing illustrating a battery pack according to the exemplary embodiment.

In FIG. 10, a battery pack 10_*i* which is one of the plurality of battery packs 10_1 to 10_*n* is shown. 'i' may be one of the natural numbers from 1 to n.

Each of the plurality of battery packs 10_1 to 10_*n* includes a plurality of battery banks 100_1 to 100*m* connected in series (wherein m is a natural number of 2 or greater). Each of the plurality of battery banks 100_1 to 100*m* includes two battery cells (for example, reference symbols 101 and 102) connected in parallel. Although it is shown in FIG. 10 that the number of battery cells constituting each of the plurality of battery banks 100_1 to 100*m* is two, the invention is not limited thereto. Each of the plurality of battery banks 100_1 to 100*m* may include three or more battery cells connected in parallel. Among the plurality of battery packs 10_1 to 10_*n*, the other battery packs may also be implemented like the battery pack 10_*i* shown in FIG. 10.

The battery management system 20 may be connected to the plurality of battery packs 10_1 to 10_*n* and measure bank voltages which are the voltages of the plurality of battery banks of each of the plurality of battery packs 10_1 to 10_*n* in a predetermined monitoring cycle.

Each of the plurality of monitoring ICs 30_1 to 30_*n* may be connected to both terminals of each battery bank of the plurality of battery banks of a corresponding battery pack, and measure the bank voltage of each battery bank. Each of the plurality of monitoring ICs 30_1 to 30_*n* may transmit the plurality of measured bank voltages to the main control IC 40. For example, as shown in FIG. 10, the monitoring IC 30_*i* is connected to both terminals of each of the plurality of battery banks 100_1 to 100*m* of the battery pack 10_*i*. Each of the plurality of monitoring ICs 30_1 to 30_*n* may receive the voltage of each of the anode and cathode of each of the plurality of battery banks of a corresponding battery pack, and measure the bank voltage of each battery bank on the basis of the difference between the anode voltage and the cathode voltage. For example, the monitoring IC 30_*i* may transmit the plurality of bank voltages BV1 to BVm of the plurality of battery banks 100_1 to 100*m* to the main control IC 40.

The battery management system 20 may obtain information on the currents and temperatures of the plurality of battery packs 10_1 to 10_*n* (hereinafter, referred to as battery pack currents and battery pack temperatures).

A current sensor 60 may measure the battery pack currents IB, and transmit information IS on the measured battery pack currents to the main control IC 40. The main control IC 40 may determine the temperature of each bank on the basis of the temperature of a battery pack including each bank.

A plurality of temperature sensors 70_1 to 70_*n* may measure the temperatures of the battery packs in which the temperature sensors are located, respectively, and transmit information items TS_1 to TS_n on the temperatures of the individual battery packs to the main control IC 40.

The battery management system 20 may control and perform cell balancing on the plurality of battery banks of each of the plurality of battery packs 10_1 to 10_*n* on the basis of the plurality of bank voltages. The battery management system 20 may estimate the SOC (State of Charge), SOH (State of Health), SOP (State of Power), etc., of each of the plurality of battery packs 10_1 to 10_*n* on the basis of the plurality of bank voltages of the plurality of battery packs 10_1 to 10_*n* and measured information on each of the plurality of battery packs 10_1 to 10_*n* (such as the battery pack current, the battery pack temperature, etc.).

The battery management system 20 may calculate the internal resistance (DCIR) values of the plurality of battery banks of each battery pack with respect to each of the plurality of battery packs 10_1 to 10_*n*, and perform correction on the internal resistance values of specific battery banks.

For example, the main control IC 40 may calculate the internal resistance value of each bank using a voltage change in the bank voltage of each of the plurality of battery banks 100_1 to 100*m* shown in FIG. 10 and a current flowing in each bank. In the exemplary embodiment, since the plurality of battery packs 10_1 to 10_*n* is connected in series, the current flowing in each bank may be the same as the battery pack current IB. A voltage change in each bank voltage may be a voltage change due to charging or discharging of the battery pack 10_*i*. The main control IC 40 may measure the voltage of a battery bank when a predetermined time elapses from the start of charging (hereinafter, referred to as the battery bank voltage after charging), and calculate the internal resistance value on the basis of the result obtained by dividing the voltage difference between the battery bank voltage before charging and the battery bank voltage after charging by the battery bank current during the charging period. Alternatively, the main control IC 40 may measure the battery bank voltage when a predetermined time elapses from the end of discharging (hereinafter, referred to as the battery bank voltage after discharging), and calculate the internal resistance value on the basis of the result obtained by dividing the voltage difference between the lowest voltage of the battery bank voltage during discharging and the battery bank voltage after discharging by the battery bank current during the discharging period. In this case, charging and discharging may be performed by a constant charging current and discharging current. Also, the main control IC 40 may consider the effect of the temperature of each bank or C-rate during charging and discharging in determining the internal resistance value of each battery bank.

The method of calculating the internal resistance of each of the plurality of battery banks 100_1 to 100*m* is not limited to the above-described one, and may be derived from the well-known methods of calculating the internal resistance of a battery cell. For example, the main control IC 40 may calculate the internal resistance value of each battery cell (for example, reference symbols 101 and 102) constituting each of the plurality of battery banks 100_1 to 100*m* by a well-known method, and calculate the parallel resistance related to the two calculated internal resistances, thereby calculating the internal resistance of each battery bank.

The main control IC 40 corrects the internal resistance values of battery banks at specific positions with respect to the plurality of battery packs 10_1 to 10_*n*. Battery banks at specific positions (hereinafter, referred to as high-resistance battery banks) refer to battery banks having internal resistance values larger than the internal resistance values of other battery banks in the plurality of battery packs 10_1 to 10_*n* due to the influence of the mechanical resistance as described above. The number of high-resistance battery banks in each of the plurality of battery packs 10_1 to 10_*n* may be one or more. The term "high-resistance battery bank" does not mean that the actual internal resistance of the corresponding battery bank is high, but may mean that the internal resistance value of the corresponding battery bank is measured higher than the actual internal resistance value due to the influence of the mechanical resistance.

The main control IC 40 may calculate the plurality of internal resistance values related to the plurality of battery banks 100_1 to 100*m*, and perform correction on the internal resistance values of high-resistance battery banks. The main control IC 40 may store data required to correct the internal resistance values of high-resistance battery banks, and calculate the internal resistance values of high-resistance battery banks with respect to the plurality of battery packs 10_1 to 10_*n*, and perform correction on the calculated internal resistance values. Data required to correct the internal resistance values of high-resistance battery banks may include data on a correction function for receiving calculated internal resistance values and correcting the internal resistance values, and parameters constituting the correction function. The parameters may be determined on the basis of the ratios of the internal resistance values of high-resistance battery banks to the median values.

For example, as the average of the resistance ratio values of the battery banks at the eighth positions in the above-described 207 battery packs, 1.062 was measured, which was 6.2% higher than the median value. In this case, the correction function is a function of multiplying the calculated internal resistance values by a predetermined correction ratio, and as the correction ratio which is a parameter of the correction function, the value obtained by subtracting 6.2% from 100%, i.e., 93.8% may be determined. The main control IC 40 may calculate the internal resistance values of high-resistance battery banks, and compensate the internal resistance values by multiplying the calculated internal resistance values by 93.8%.

The main control IC 40 may diagnose whether each battery bank is abnormal, on the basis of the internal resistance values of the plurality of battery banks of each of the plurality of battery packs 10_1 to 10_*n*. For example, the main control IC 40 may diagnose that battery banks having resistance values larger than a predetermined threshold among the internal resistance values of the plurality of battery banks are abnormal.

While this invention has been described in connection with what is presently considered to be practical exemplary embodiments, it is to be understood that the invention is not limited to the disclosed embodiments. On the contrary, it is intended to cover various modifications and equivalent arrangements included within the spirit and scope of the appended claims.

The invention claimed is:

1. A battery system comprising:

a plurality of battery packs, each of which includes a plurality of battery banks at a corresponding plurality of battery bank positions; and a battery management system in communication with the plurality of battery packs and configured to:

measure, for the plurality of battery banks in each battery pack, a corresponding plurality of battery bank voltages and battery bank currents;

calculate a plurality of internal resistance (DCIR) values of the plurality of battery banks in each of the plurality of battery packs based on the corresponding plurality of battery bank voltages and battery bank currents;

classify the plurality of internal resistance values in each battery pack by the plurality of battery bank positions, and predetermine as a first position in each battery pack the position of a battery bank having a first internal resistance value determined to be outside of a normal range among the plurality of internal resistance values of the battery pack;

perform correction on the first internal resistance value at the predetermined first position in each battery pack; and diagnose whether the battery bank at the predetermined first position is abnormal, based on the corrected first internal resistance value, wherein the battery management system selects the corrected first internal resistance value as an actual internal resistance value of the battery bank at the predetermined first position in each battery pack, wherein each of the plurality of battery banks includes a plurality of battery cells connected in parallel, and the predetermined first position is a same position in each of the plurality of battery packs, and wherein in each battery pack, a mechanical resistance of the first internal resistance value of the battery bank at the predetermined first position is greater than that of the battery banks other positions in a corresponding battery pack.

2. The battery system of claim 1, wherein the battery management system corrects the first internal resistance value by multiplying the first internal resistance value by a predetermined ratio smaller than 1.

3. The battery system of claim 2, wherein the predetermined ratio is determined based on a result obtained by dividing the first internal resistance value of the battery bank at the predetermined first position in each battery pack by a median value of the plurality of internal resistance values of the plurality of battery banks constituting a corresponding battery pack.

4. The battery system of claim 1, wherein the battery management system comprises:

a plurality of monitoring ICs that are connected to the plurality of battery packs, and measures the plurality of battery bank voltages and battery bank currents of the plurality of battery banks; and a main control IC that calculates the plurality of internal resistance values of the plurality of battery banks of each battery pack based on the plurality of battery bank voltages and battery bank currents, with respect to each of the plurality of battery packs, and corrects the first internal resistance value of the battery bank at the predetermined first position based on a correction ratio.

5. The battery system of claim 4, wherein the main control IC corrects the first internal resistance value of the battery bank at the predetermined first position by multiplying the first internal resistance value of the battery bank at the predetermined first position by the correction ratio, and wherein the correction ratio is smaller than 1.

6. The battery system of claim 5, wherein the correction ratio is determined based on a result obtained by dividing the first internal resistance value of the battery bank at the predetermined first position in each battery pack by a median value of the plurality of internal resistance values of the plurality of battery banks constituting a corresponding battery pack.

7. The battery system of claim 1, wherein the battery management system comprises an internal resistance evaluation device comprising:

a normality verifying unit configured to verify normality with respect to the plurality of internal resistance values of the plurality of battery banks constituting each battery pack with respect to the plurality of battery packs;

a control chart analyzing unit configured to perform the classification of the plurality of internal resistance values in each battery pack by the plurality of battery bank positions and the predetermination of the first position in each battery pack; and an internal resistance analyzing unit configured to perform the correction on the first internal resistance value at the predetermined first position in each battery pack.

8. The battery system of claim 7, wherein the internal resistance analyzing unit calculates a first value with respect to each of the plurality of battery packs by dividing the internal resistance value of the battery bank at the first position by a median value of the plurality of internal resistance values of the plurality of battery banks constituting each battery pack, and determines a degree of the correction based on an average of the plurality of first values with respect to all of the plurality of battery packs.

9. The battery system of claim 8, wherein the internal resistance analyzing unit determines, as the correction degree, a value obtained by subtracting 1 from the average of the plurality of first values.

10. The battery system of claim 8, wherein the normality verifying unit verifies the normality of the plurality of internal resistances at each battery bank position with respect to all of the plurality of battery packs.

11. The battery system of claim 1, wherein the battery management system estimates at least one of SOC (State of Charge), SOH (State of Health), and SOP (State of Power) based on the plurality of bank voltages of the plurality of battery banks and measured information on each of the plurality of battery packs.

12. The battery system of claim 1, wherein the battery management system controls and performs cell balancing on the plurality of battery banks of each of the plurality of battery packs based on the plurality of battery bank voltages.

* * * * *